United States Patent
Inamori et al.

(10) Patent No.: US 9,543,480 B2
(45) Date of Patent: *Jan. 10, 2017

(54) CERAMIC COMPOSITE FOR LIGHT CONVERSION AND METHOD FOR MANUFACTURE THEREOF

(75) Inventors: Dai Inamori, Ube (JP); Takafumi Kawano, Ube (JP); Toshiro Doi, Fukuoka (JP); Syuhei Kurokawa, Fukuoka (JP)

(73) Assignee: Ube Industries, Ltd., Ube-shi (JP)

( * ) Notice: Subject to any disclaimer, the term of this patent is extended or adjusted under 35 U.S.C. 154(b) by 772 days.

This patent is subject to a terminal disclaimer.

(21) Appl. No.: 13/992,805

(22) PCT Filed: Dec. 2, 2011

(86) PCT No.: PCT/JP2011/077918
§ 371 (c)(1),
(2), (4) Date: Aug. 28, 2013

(87) PCT Pub. No.: WO2012/077599
PCT Pub. Date: Jun. 14, 2012

(65) Prior Publication Data
US 2013/0327985 A1    Dec. 12, 2013

(30) Foreign Application Priority Data

Dec. 10, 2010  (JP) ................. 2010-275305

(51) Int. Cl.

| B24B 37/00 | (2012.01) |
|---|---|
| C09K 11/08 | (2006.01) |
| C09K 11/80 | (2006.01) |
| C09K 3/14 | (2006.01) |
| H01L 33/50 | (2010.01) |
| H01B 3/12 | (2006.01) |
| B24B 37/04 | (2012.01) |
| C09G 1/02 | (2006.01) |
| C04B 35/117 | (2006.01) |
| C04B 35/44 | (2006.01) |
| C04B 35/65 | (2006.01) |
| H01L 21/304 | (2006.01) |

(52) U.S. Cl.
CPC ........... *H01L 33/502* (2013.01); *B24B 37/044* (2013.01); *C04B 35/117* (2013.01); *C04B 35/44* (2013.01); *C04B 35/652* (2013.01); *C09G 1/02* (2013.01); *C09K 3/1409* (2013.01); *H01B 3/12* (2013.01); *C04B 2235/3225* (2013.01); *C04B 2235/3229* (2013.01); *C04B 2235/6581* (2013.01); *C04B 2235/764* (2013.01); *C04B 2235/80* (2013.01); *H01L 33/50* (2013.01)

(58) Field of Classification Search
CPC .............................. C09K 11/025; C04B 41/91
See application file for complete search history.

(56) References Cited

U.S. PATENT DOCUMENTS

| 5,484,752 A | 1/1996 | Waku et al. |
|---|---|---|
| 5,569,547 A | 10/1996 | Waku et al. |
| 5,902,963 A | 5/1999 | Chappaz et al. |
| 9,334,197 B2 * | 5/2016 | Inamori ............... C04B 35/117 |

FOREIGN PATENT DOCUMENTS

| CN | 1621469 A | 6/2005 |
|---|---|---|
| JP | 7149597 A | 6/1995 |
| JP | 7187893 A | 7/1995 |
| JP | 881257 A | 3/1996 |
| JP | 8253389 A | 10/1996 |
| JP | 8253390 A | 10/1996 |
| JP | 967194 A | 3/1997 |
| JP | 2004335722 A | 11/2004 |
| JP | 2008277341 A | 11/2008 |
| SU | 483381 A | 12/1975 |
| TW | 201006015 A1 | 2/2010 |
| WO | 2007018222 A1 | 2/2007 |
| WO | 2007148829 A1 | 12/2007 |
| WO | 2009031696 A1 | 3/2009 |

* cited by examiner

*Primary Examiner* — Carol M Koslow
(74) *Attorney, Agent, or Firm* — The Webb Law Firm (57) ABSTRACT

A ceramic composite for light conversion comprising a solidified body in which crystalline phases of oxides are three-dimensionally entangled and a method for manufacture thereof. A manufacture method of a ceramic composite for light conversion is characterized in that a polishing step is provided in a chemical mechanical polishing (CMP) process applied to the surface of a solidified body with a structure in which an $Al_2O_3$ phase and other phases are three-dimensionally entangled.

12 Claims, 5 Drawing Sheets

CERAMIC COMPOSITE FOR LIGHT CONVERSION AND METHOD FOR MANUFACTURE THEREOF

TECHNICAL FIELD

The present invention relates to a ceramic composite for light conversion, which is used in a light emitting diode utilizing in displays, lighting, and light source of backlight, and a method for manufacture thereof.

BACKGROUND ART

In recent years, research and development of a white light-emitting device using a blue light-emitting element as a light source has been actively carried out. In particular, since a white light-emitting device using a blue light-emitting element not only has a long service life and smaller power consumption than an incandescent lamp and a fluorescent lamp, but also uses no hazardous substance such as mercury, practical use of lighting equipment using a white light-emitting device are presently well underway.

A method most frequently used to obtain white light using blue color of a blue light-emitting element as a light source is a method of obtaining a pseudo-white color by mixing blue with yellow, which is the complementary color of blue.

For example, in a typical white light-emitting device, a blue light-emitting element is sealed with a transparent resin containing a yellow light-emitting phosphor (for example, $Y_3Al_5O_{12}$ (YAG) phosphor). The blue light-emitting element emits blue light (wavelength: from 450 to 460 nm) and parts of the blue light excite a YAG phosphor, from which yellow light is emitted.

However, when a blue light-emitting element is sealed with a light-transmitting resin such as an epoxy resin, it is known that the light emitted from a light-emitting element or the light from outside reacts with the epoxy resin leading to deterioration such as yellowing. Also, when a high current is used to obtain high brightness in a white light-emitting device, the element itself generates heat to cause deterioration of a sealing resin. Further, the sealing resin absorbs moisture and the like potentially decreasing the luminous efficacy.

Therefore, the present inventors have proposed a white light-emitting device provided with a blue light-emitting element and a ceramic composite for light conversion formed of a solidified body formed by continuously and three-dimensionally entangling with each other the plurality of crystalline phases of oxides containing an $Y_3Al_5O_{12}$ phase (hereinafter denoted as YAG:Ce phase) containing fluorescence emitting Ce and an $Al_2O_3$ phase. A ceramic composite for light conversion can generate stable yellow fluorescence with homogenous distribution because of uniform distribution of the phosphor phase, and has excellent durability because of ceramic, thereby solving the problems generated when sealed with an epoxy resin and the like, and a white light-emitting device with high reliability can be provided.

The structure of a white light-emitting device using the ceramic composite for light conversion includes, for example, a blue light-emitting element to be flip-chip mounded, a circuit board on which a wiring pattern is formed to supply power to the blue light-emitting element, and a ceramic composite for light conversion directly bonded to the blue light-emitting element.

As described in Patent Literature 1, such a substrate for a light-emitting diode was previously proposed that a single-crystal layer enabling the formation of a light-emitting diode element and a ceramic composite layer for light conversion formed of a solidified body formed by continuously and three-dimensionally entangling with each other the crystalline phases of at least two kinds or more of oxides selected from a single metal oxide and complex metal oxides, are stacked. In the document, a method of direct joining at high temperature or a method of interposing a very small amount of a low melting material as a joining layer were disclosed in order to stack the single-crystal layer and the ceramic composite layer for light conversion, but when the joining surface between the single-crystal layer and the ceramic composite layer for light conversion is flat, not only the above method but also a surface activated bonding method can be used for directing bonding between the ceramic composite layer for light conversion and the single-crystal layer, so that flatness of the bonding surface is very important.

CITATION LIST

Patent Literatures

Patent Literature 1: WO 2007-018222 A

SUMMARY OF INVENTION

Technical Problem

However, a polycrystalline substance formed of the plurality of crystalline phases of oxides is constituted with many crystal grains with various different orientations of the crystalline plane, and the processing speed in the polishing step is varied depending on the plane orientation of crystals so that there is a problem of limiting a level of the surface flatness.

Therefore, an object of the present invention is to provide a ceramic composite for light conversion with the flat surface even if it is a solidified body formed by continuously and three-dimensionally entangling with each other the plurality of crystalline phases of oxides, and a method for manufacture thereof.

Solution to Problem

The present inventors conducted extensive studies to achieve the foregoing object and as a result, found that the surface of a solidified body comprising the $Al_2O_3$ phase and the crystalline phases of oxides other than $Al_2O_3$ can be flatten, specifically enabling the step level difference between the crystalline phases thereof to be equal to 0.010 μm or less by applying the chemical mechanical polishing (CMP) process to a solidified body with the structure in which the $Al_2O_3$ phase and the crystalline phase of oxides are continuously and three-dimensionally entangled with each other with a polishing liquid of which pH is adjusted between 11 and 12. That is, according to the present invention, there is provided a manufacture method of a ceramic composite for light conversion characterized by comprising a polishing step in which the CMP process is applied to the surface of a solidified body with a structure in which the $Al_2O_3$ phase and the crystalline phase of oxides other than $Al_2O_3$ are continuously and three-dimensionally entangled with each other, wherein pH of a polishing liquid is adjusted between 11 and 12 when performing the CMP process.

Also, according to the present invention, there is provided a ceramic composite for light conversion comprising a solidified body in which the $Al_2O_3$ phase and the crystalline phase of oxides other than $Al_2O_3$ are continuously and three-dimensionally entangled with each other, wherein the step level difference between the $Al_2O_3$ phase and the crystalline phase of oxides on the surface of the solidified is equal to 0.010 μm or less.

Advantageous Effects of Invention

As described above, according to the present invention, there is provided a ceramic composite for light conversion with the flat surface even in a solidified body formed by continuously and three-dimensionally entangling with each other the plurality of crystalline phases of oxides, and a method for manufacture thereof.

DESCRIPTION OF EMBODIMENTS

A ceramic composite for light conversion according to an embodiment of the present invention and a method for manufacture thereof will be next described below. When a solidified body to be polished are constituted with two different crystalline phases of the $Al_2O_3$ phase and the crystalline phase of oxides other than $Al_2O_3$ different in the material properties (hardness and crystal orientation or the like) which are continuously and three-dimensionally entangled with each other, a polishing speed in a polishing step is varied depending on each crystalline phase. However, according to a manufacture method of a ceramic composite for light conversion according to the present invention, a polishing speed of the $Al_2O_3$ phase and the crystalline phase of oxides other than $Al_2O_3$ can be controlled by adjusting pH of a polishing liquid to from 11 to 12 when performing the CMP process, thereby enabling the step level difference in the surface between the $Al_2O_3$ phase and the crystalline phase of oxides other than $Al_2O_3$ to be equal to 0.010 μm or less. For example, when the surface activated bonding process is used, joining can be achieved even when the step level difference exceeds 0.010 μm. However the larger the step level difference, the weaker the joining strength is, thereby potentially generating the uneven joining surface. In this case, reduction of the step level difference to 0.010 μm or less can give enough the joining strength not causing a problem in practical use.

In a ceramic composite for light conversion according to the present invention and a method for manufacture thereof, the step level difference between the $Al_2O_3$ phase and the crystalline phase of oxides other than $Al_2O_3$ in the surface of a solidified body constituting a ceramic composite for light conversion can be evaluated by determining the level of two points, one point being any point of the surface in one crystalline phase constituting a convex shape and other point being any point of the surface in other crystalline phase constituting a concave shape from any plane parallel to the plane to be processed as a reference plane and then calculating the difference of the two levels as an absolute value. Specifically, points in an adjacent area including the interface between the crystalline phase constituting a convex shape and the crystalline phase constituting a concave shape are preferred as any point on the surface of the crystalline phase constituting a convex shape and any point on the surface of the crystalline phase constituting a concave shape. Further, 12 points are selected as the measuring point in the present invention, and the step level difference is defined as an average of the measured values. Therefore, the step level difference between the $Al_2O_3$ phase and the crystalline phase of oxides other than $Al_2O_3$ to be equal to 0.010 μm or less means that the average value of measured results in the step level difference at any 12 points using the method described above is equal to 0.010 μm or less.

A polishing liquid used in a manufacture method of a ceramic composite for light conversion according to the present invention is prepared in a form of slurry, and preferably contains silica particles, and the content thereof is preferably below from 0.1 to 5% by mass, more preferably from 0.4 to 4% by mass. When the content of silica particles in the polishing liquid is below 0.1% by mass, the polishing speed may be potentially reduced, whereas when the content is equal to 5% by mass or more, the polishing speed is improved but the step level difference between the $Al_2O_3$ phase and the crystalline phase of oxides other than $Al_2O_3$ may become larger.

A polishing liquid used in a manufacture method of a ceramic composite for light conversion according to the present invention can be obtained, for example, by adding an aqueous alkali solution such as sodium hydroxide to a commercially available polishing liquid for CMP for adjusting pH. A commercially available polishing liquid for CMP used includes, for example, polishing slurry based on colloidal silica manufactured by Fujimi Incorporated of "COMPOL (registered trademark) Type 20", "COMPOL (registered trademark) Type 50", "COMPOL (registered trademark) Type 80", and "COMPOL (registered trademark) Type 120" or a polishing slurry based on colloidal silica manufactured by Fuso Chemical Industries Co., Ltd. of "Quartron (registered trademark) PL Series". Such a slurry can be diluted with pure water as needed to adjust the content of silica particles, and further an alkali solution may be added to adjust pH to yield a polishing liquid used in the present invention.

In a manufacture method of a ceramic composite for light conversion according to the present invention, since pH of a polishing liquid may be potentially reduced during the CMP process, pH can be kept within a range of from 11 to 12 by adding an alkaline solution as needed. PH of a polishing liquid can be kept between 11 and 12 when performing the CMP process, more preferably kept between 11.3 and 11.6. PH of the polishing liquid can be selected after considering the stability of the polishing liquid in addition to take into account the step level difference between the $Al_2O_3$ phase and the crystalline phase of oxides other than $Al_2O_3$. When pH of a polishing liquid exceeds 12, a problem of coagulating silica particles in a polishing liquid occurs, causing a problem of making difficult stable feed of a polishing liquid. When pH of a polishing liquid is below 11, elimination of the step level difference between the $Al_2O_3$ phase and the crystalline phase of oxides other than $Al_2O_3$ becomes difficult.

In a manufacture method of a ceramic composite for light conversion according to the present invention, the CMP process can be performed using any polishing equipment. For example, a solidified body of a complex oxide is preferably mounted on a rotating polishing head to perform the CMP process, and a solidified body mounted on a polishing head revolving at approximately 50 rpm (revolution/minute) can be pressed against a polishing pad revolving approximately at 50 rpm to perform the CMP process.

In a manufacture method of a ceramic composite for light conversion according to the present invention, a pressing load per unit area in the CMP process is preferably from 5 to 50 kPa, and more preferably from 10 to 33 kPa. When a pressing load per unit area is below 5 kPa, the polishing speed may become slower, whereas when it exceeds 50 kPa, a polishing liquid may be difficult to enter between the surface to be polished and a polishing pad, potentially causing reduction of the polishing speed and generating polishing scratches, resulting in no value of a product for a practical use.

A manufacture method of a ceramic composite for light conversion according to the present invention preferably involves melting of a raw material oxide, followed by fabricating a solidified body to the predetermined thickness, polishing the surface thereof in advance by a process such as fine grinding to produce a mirror surface, and then performing the CMP process. The fine grinding to produce a mirror surface is performed by the mechanical polishing (MP).

A solidified body used in a manufacture method of a ceramic composite for light conversion according to the present invention can be prepared by melting a raw material oxide, followed by solidification. For example, a solidified body can be obtained by a simple method of charging the raw material oxide into a crucible heated to the predetermined temperature to melt and then cooling it by controlling the cooling temperature to solidify. However a most preferable method is to prepare a solidified body by the unidirectional solidification process, because crystal phase contained in the solidified body continuously grow in a single crystalline state, thereby decreasing attenuation of light in the member of the light-emitting device.

Such solidified bodys used include ceramic complex materials except for not containing the fluorescence emitting crystalline phase of oxides but similar to those disclosed in JP 7-149597 A, JP 7-187893 A, JP 8-81257 A, JP 8-253389 A, JP 8-253390 A, and JP 9-67194 A previously applied by the present applicant, and corresponding United States Patent Applications (U.S. Pat. Nos. 5,569,547, 5,484,752, and 5,902,963), and those manufactured by a method disclosed in these applications (or patent) can be used.

In a solidified body used in a manufacture method of a ceramic composite for light conversion according to the present invention, the crystalline phase of oxides other than $Al_2O_3$ is preferably the fluorescence emitting YAG:Ce phase or the YAG phase containing Ce and Gd (hereinafter denoted as YAG:Gd, Ce phase). In this case, since the hardness of the YAG:Ce phase or the YAG:Gd, Ce phase is smaller than the hardness of the $Al_2O_3$ phase, a mechanical abrasive force applied to the YAG:Ce phase or the YAG:Gd, Ce phase is relatively larger as compared to a force applied to the $Al_2O_3$ phase when performing the CMP process, the YAG:Ce phase or the YAG:Gd, Ce phase is dented relative to the $Al_2O_3$ phase. However, since the YAG:Ce phase or the YAG:Gd, Ce phase has higher alkali resistance as compared to the $Al_2O_3$ phase, the polishing speed of the $Al_2O_3$ phase and the YAG:Ce phase or the YAG:Gd, Ce phase can be controlled by using a polishing liquid of which pH is adjusted between 11 and 12. For example, a polishing speed of the $Al_2O_3$ phase can be increased by increasing pH of a polishing liquid when performing the CMP process, whereas to the contrary, a polishing speed of the YAG:Ce phase or the YAG:Gd, Ce phase can be increased by decreasing pH of a polishing fluid when performing the CMP process. The step level difference between the $Al_2O_3$ phase and the YAG:Ce phase or the YAG:Gd, Ce phase can be adjusted to be equal to 0.010 μm or less by adjusting pH of a polishing liquid between 11 and 12 when performing the CMP process.

Further, it is preferred that the crystalline phase of oxides other than $Al_2O_3$ is the YAG:Ce phase or the YAG:Gd, Ce phase, since, when a ceramic composite for light conversion receives blue light, parts of blue light pass through the $Al_2O_3$ phase and parts of blue light are absorbed by the crystalline phase of oxides other than $Al_2O_3$ to emit yellow fluorescence, thereby mixing blue light with yellow light to emit white light. The ceramic complex for light conversion of which the crystalline phase of oxides other than $Al_2O_3$ is a fluorescence emitting phosphor and the YAG:Ce phase or the YAG:Gd, Ce phase is commonly known, and disclosed in WO 2008-041566 previously applied by the present applicant.

Since the YAG:Ce phase emits fluorescence with the peak wavelength of from 530 to 560 nm and the YAG:Gd, Ce phase emits fluorescence at the peak wavelength of from 540 to 580 nm under the violet to blue excitation light of from 400 to 500 nm, the solidified body in which the crystalline phase of oxides other than $Al_2O_3$ is the YAG:Ce phase or the YAG:Gd, Ce phase is suitable for use as a light conversion member for a white light-emitting device, in which the emitting element for blue or violet light is used in combination with the light conversion member.

There is no boundary layer such as an amorphous layer at the boundary of each phase of a solidified body, and the crystalline phases of oxides themselves are directly contacted with each other. Therefore, light loss inside a ceramic composite for light conversion is small and the light transmittance is high. Also, since the fluorescence emitting crystalline phase of oxides (fluorescence phase) has a structure which is continuously and three-dimensionally entangled with each other and each crystalline phase of oxides is as a whole uniformly distributed within a ceramic composite for light conversion, homogeneous fluorescence can be obtained without partial uneven distribution. Further,. fluorescence from the phosphor phase and transmitted light from the transmitted-light phase can be simultaneously obtained by entering the blue excitation light into a ceramic composite for light conversion. The excitation light can efficiently enter into a ceramic composite for light conversion by directly bonding the blue light-emitting element to a ceramic composite for light conversion, yielding white light with strong intensity. Then, for example, using the surface activated bonding process direct bonding of a ceramic composite for light conversion to a blue light-emitting element can be applied by making very flat the bonding surface of a ceramic composite for light conversion with a blue light-emitting element.

Since a solidified body is constituted only with inorganic oxide ceramics, it has good heat resistance and excellent durability as well as no deterioration and the like on light exposure. Therefore, a ceramic composite for light conversion suitable for constituting a white light-emitting device with good reliability and high efficiency can be provided by a combination with the blue light-emitting element.

A ceramic composite for light conversion according to the present invention is formed of a solidified body with a structure in which the $Al_2O_3$ phase and the crystalline phase of oxides other than $Al_2O_3$ are continuously and three-dimensionally entangled with each other, and is characterized in that the step level difference between the $Al_2O_3$ phase and the crystalline phase of oxides other than $Al_2O_3$ is equal to 0.010 μm or less. The $Al_2O_3$ phase and the crystalline phase of oxides other than $Al_2O_3$ have a structure which is continuously and three-dimensionally entangled with each other and the $Al_2O_3$ phase and the crystalline phase of oxides other than $Al_2O_3$ are as a whole uniformly distributed within a ceramic composite for light conversion. Also, it is preferred that the surface of a ceramic composite for light conversion includes the $Al_2O_3$ phase and the crystalline phase of oxides other than $Al_2O_3$ and is extremely flat such that the step level difference between the $Al_2O_3$ phase and the crystalline phase of oxides other than $Al_2O_3$ is equal to 0.010 μm or less. Such a step level difference can be adjusted by using a polishing liquid for CMP containing silica particles and by properly selecting the content thereof, pH of a polishing liquid for CMP and a pressing load per unit area when performing the CMP process.

Figure 1:
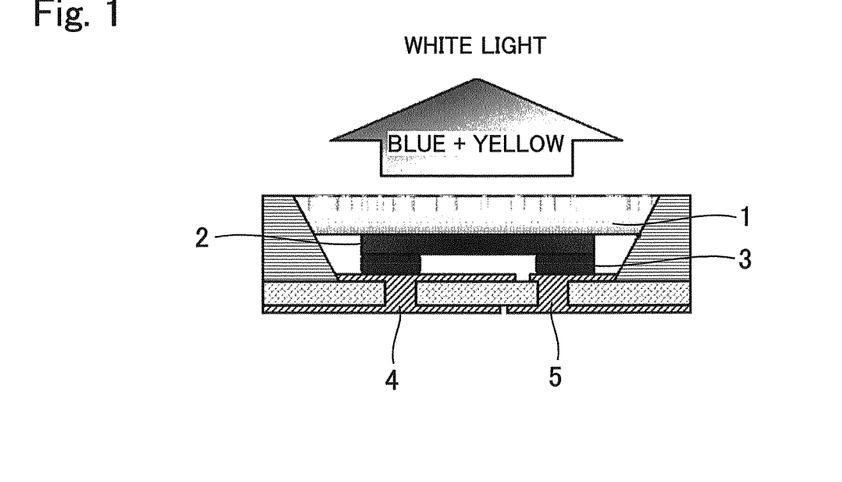
FIG. 1 is a schematic cross-sectional diagram illustrating a light emitting device using a ceramic composite for light conversion according to the present invention.

FIG. 1 illustrates a schematic cross-sectional diagram illustrating a light emitting device using a ceramic composite for light conversion manufactured by a method of manufacturing a ceramic composite for light conversion according to the present invention. The light emitting device includes a light emitting element 2 emitting the light with the peak wavelength of from 400 to 500 nm and a ceramic composite for light conversion 1 containing the crystalline phase of oxides emitting yellow fluorescence with the peak wavelength of from 550 to 560 nm, and is characterized by utilizing the light transmitted through the ceramic composite and the light modified through wavelength conversion by the phosphor phase contained in the ceramic composite when the ceramic composite is irradiated with the light emitted from the light emitting element 2. In FIG. 1, symbols 3, 4, and 5 denote an electrode terminal for flip-chip mounting, an anode electrode, and a cathode electrode, respectively.

A light emitting element which emits the light with the peak wavelength of from 400 to 500 nm is an element emitting the violet to blue light, and for example, the violet to blue light emitted by a light-emitting diode or an element emitting a laser beam enters into a ceramic composite for light conversion, in which chromaticity is adjusted for yielding white light in accordance with the wavelength thereof. The yellow fluorescence from the thereby excited phosphor phase and the violet to blue transmitted light from the non-phosphor phase are mixed homogeneously in the crystalline phase of oxides with the structure which is continuously and three-dimensionally entangled with each other, yielding white light with little color fluctuation. A white light-emitting device in which a light emitting diode is used as the light emitting element is denoted as a white light-emitting diode.

EXAMPLES

Examples of a ceramic composite for light conversion according to the present invention and a method for manufacture thereof will be next described, but examples are in no way to intend limiting the present invention

REFERENCE EXAMPLE

At first, a solidified body used in Examples was manufactured. An α-$Al_2O_3$ powder (purity: 99.99%), a $Y_2O_3$ powder (purity: 99.9%), and a $CeO_2$ powder (purity: 99.9%) were weighed so as to be 0.82 moles based on $AlO_{3/2}$, 0.175 moles based on $YO_{3/2}$, and 0.005 moles, respectively. These powders were mixed in ethanol by wet ball milling for 16 hours, followed by removing ethanol using an evaporator to yield a raw material powder. The raw material powder was premelted in a vacuum furnace to yield a raw material for the unidirectional solidification. Next, the raw material was charged as it is into a molybdenum crucible, which was placed on a unidirectional solidification system to melt the raw material under the pressure of $1.33 \times 10^{-3}$ Pa ($10^{-5}$ Torr). Next, the crucible was lowered under the same atmosphere at a speed of 5 mm/hour to yield a solidified body with the structure of which the $Al_2O_3$ (sapphire) phase and the fluorescence emitting crystalline phase of oxides (YAG phase) were continuously and three-dimensionally entangled with each other.

Figure 2:
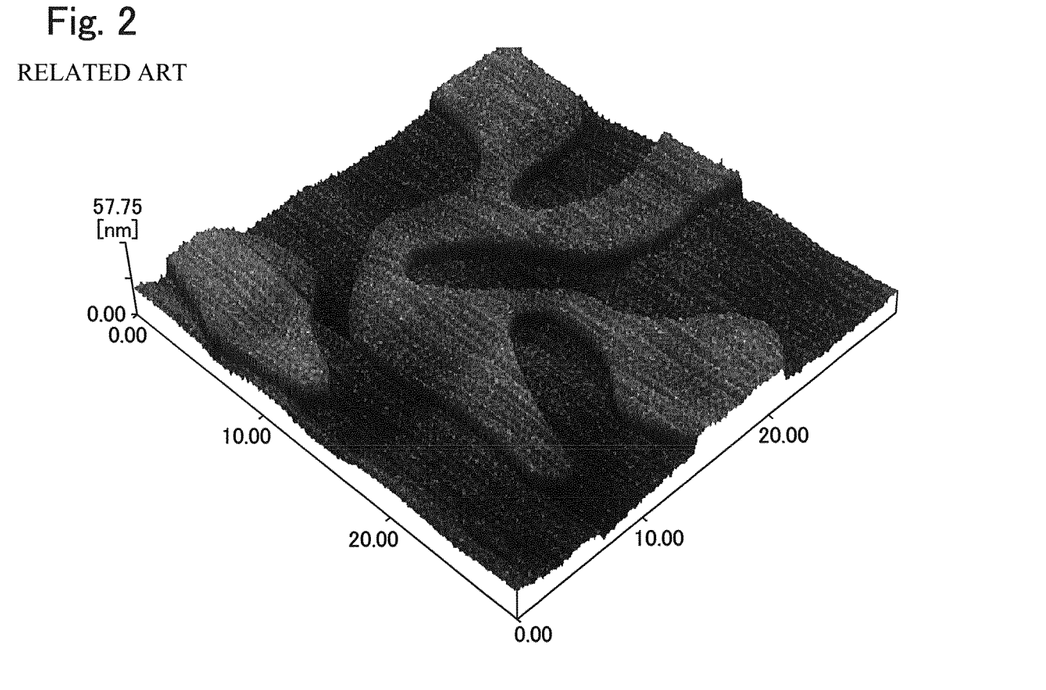
FIG. 2 is a perspective view illustrating a surface configuration of a solidified body obtained as a Reference Example in an Example of a manufacture method of a ceramic composite for light conversion according to the present invention.

The solidified body obtained was treated with the general fine grinding to produce a mirror surface and the surface configuration and the step level difference of the solidified body were measured using an atomic force microscope (AFM). FIG. 2 illustrates the surface of the solidified body treated with the fine grinding to produce a mirror surface used for a ceramic composite for light conversion. When the solidified body used for a ceramic composite for light conversion was treated with the general fine grinding to produce a mirror surface, the surface configuration of the $Al_2O_3$ phase becomes a convex shape due to the difference of the material properties, forming the surface in which the step level difference between the $Al_2O_3$ phase and the fluorescence emitting crystalline phase of oxides (YAG phase) was about 0.020 μm.

Example 1

Next, a ceramic composite for light conversion according to Example 1 of the present invention will be described. At first, a solidified body manufactured in Reference Example was cut into a disc-shaped sample with the diameter of 2 inches and the thickness of 0.4 mm. When the disc-shaped sample was treated in advance with the fine grinding to produce a mirror surface and the surface configuration and step level difference of the disc-shaped sample was measured using an atomic force microscope (AFM), the step level difference of the $Al_2O_3$ phase and the fluorescence emitting crystalline phase of oxides (YAG phase) was 0.020 The disc-shaped sample was treated with the CMP process under the following condition to yield a ceramic composite for light conversion according to Example 1. A polishing liquid was prepared by adding a 1 mol/L NaOH aqueous solution to "COMPOL (registered trademark) Type 120", a colloidal silica slurry for polishing manufactured by Fujimi Incorporated which was diluted with pure water to 0.4% by mass for adjusting pH to 11.5. And the polishing liquid for CMP was fed to a polishing pad IC1000 (registered trademark) manufactured by Nitta Haas Incorporated having the lattice-shaped grooves with the spacing of 15 mm and the polishing pad was pressed against the disc-shaped sample of the ceramic composite for light conversion at a pressing load per unit area of 10 kPa to operate the CMP process for 150 minutes as a process time. During the CMP process a 1 mol/L NaOH aqueous solution was added as needed to maintain pH of the polishing liquid for CMP in a range of from 11 to 12.

Figure 3:
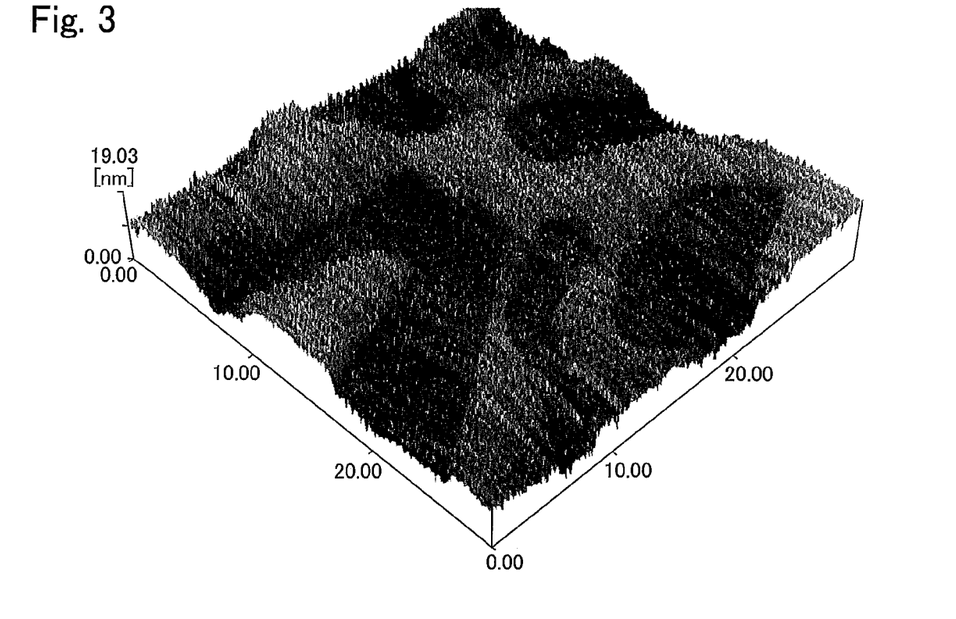
FIG. 3 is a perspective view illustrating a surface configuration of a ceramic composite for light conversion according to Example 1.

After the CMP process, the surface configuration and step level difference of a ceramic composite for light conversion according to Example 1 was measured using an atomic force microscope (AFM), and an extremely flat surface was obtained such that the step level difference between the $Al_2O_3$ phase and the fluorescence emitting crystalline phase of oxides (YAG phase) was equal to 0.003 µm or less. The results are shown in Table 1. Also, FIG. 3 illustrates the surface configuration of the ceramic composite for light conversion according to Example 1.

TABLE 1

| | Applied pressure (kPa) | Spacing of pad grooves (mm) | Content of colloidal silica particles (% by mass) | pH of polishing liquid | Process time (min) | Step level difference (µm) |
|---|---|---|---|---|---|---|
| Example 1 | 10 | 15 | 0.4 | 11.3~11.5 | 150 | 0.003 |
| Example 2 | 10 | 15 | 4 | 11.3~11.5 | 60 | 0.005 |
| Example 3 | 10 | 15 | 2 | 11.3~11.6 | 270 | 0.003 |
| Example 4 | 13 | 15 | 2 | 11.3~11.6 | 270 | 0.003 |
| Example 5 | 33 | 15 | 2 | 11.3~11.6 | 180 | 0.004 |
| Example 6 | 50 | 15 | 2 | 11.3~11.6 | 120 | 0.007 |
| Example 7 | 33 | 7 | 2 | 11.3~11.6 | 90 | 0.004 |
| Comparative Example 1 | 10 | 15 | 40 | 9.0~10.0 | 60 | 0.05 |
| Comparative Example 2 | 10 | 15 | 0.4 | 10.0~10.9 | 60 | 0.1 |
| Comparative Example 3 | 10 | 15 | 2 | 8.0~9.0 | 60 | 0.05 |
| Comparative Example 4 | 13 | 15 | 2 | 8.0~9.0 | 270 | 0.02 |

Example 2

Next, a ceramic composite for light conversion according to Example 2 of the present invention will be described. A ceramic composite for light conversion according to Example 2 was prepared similarly to Example 1 except for making the content of colloidal silica particles in a polishing liquid for CMP to be 4% by mass and a CMP process time to be 60 minutes.

Figure 4:
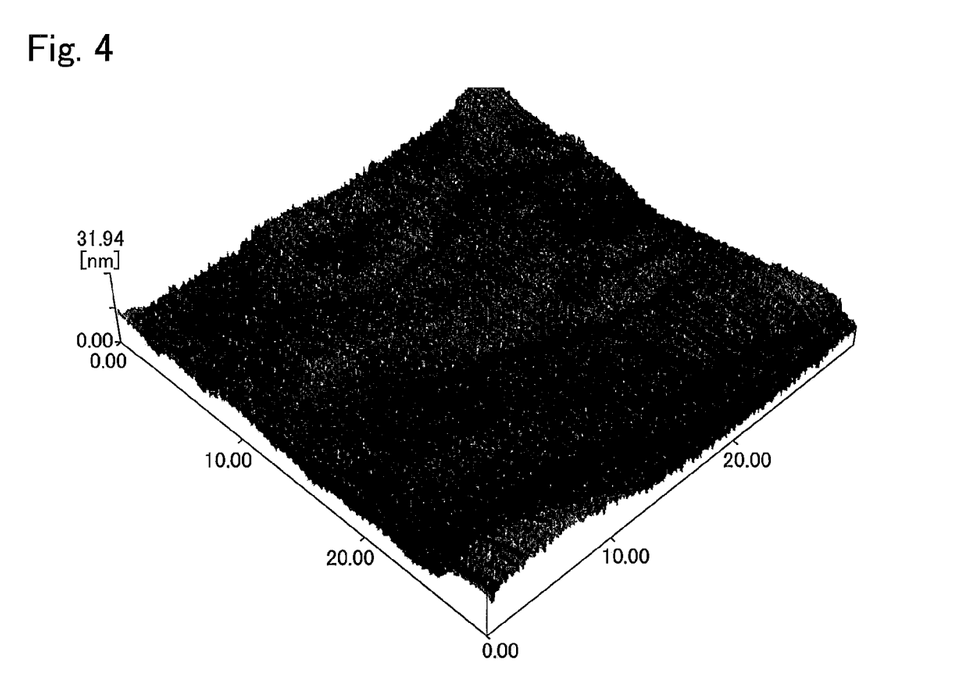
FIG. 4 is a perspective view illustrating a surface configuration of a ceramic composite for light conversion according to Example 2.

After the CMP process, the surface configuration and step level difference of a ceramic composite for light conversion according to Example 2 were measured using an atomic force microscope (AFM), and an extremely flat surface was obtained such that the step level difference between the $Al_2O_3$ phase and the fluorescence emitting crystalline phase of oxides (YAG phase) was equal to 0.005 µm or less. The results are shown in Table 1. Also, FIG. 4 illustrates the surface configuration of the ceramic composite for light conversion according to Example 2.

Example 3

Next, a ceramic composite for light conversion according to Example 3 of the present invention will be described. A solidified body manufactured in Reference Example was cut into a disc-shaped sample similarly to Example 1. When the disc-shaped samples was treated in advance with the fine grinding to produce a mirror surface and the surface configuration and step level difference of the disc-shaped sample were measured using an atomic force microscope (AFM), the step level difference between the $Al_2O_3$ phase and the fluorescence emitting crystalline phase of oxides (YAG phase) was 0.015 µm. The disc-shaped sample was cut into a square-shaped thin plate sample with a size of 15 mm×15 mm and treated with the CMP process under the following condition to yield a ceramic composite for light conversion according to Example 3. A polishing liquid was prepared by adding a 1 mol/L NaOH aqueous solution to "Quartron (registered trademark) PL-2L", a colloidal silica slurry for polishing manufactured by Fuso Chemical Industries Co., Ltd. which was diluted with pure water to 2% by mass for adjusting pH to 11.5. And the polishing liquid for CMP was fed to a polishing pad IC1000 (registered trademark) manufactured by Nitta Haas Incorporated having the lattice-shaped grooves with the spacing of 15 mm and the polishing pad was pressed against the plate-shaped sample of the ceramic composite for light conversion at a pressing load per unit area of 10 kPa to operate the CMP process for 270 minutes as a process time. During the CMP process a 1 mol/L NaOH aqueous solution was added as needed to maintain pH of the polishing liquid for CMP in a range of from 11 to 12.

Figure 5:
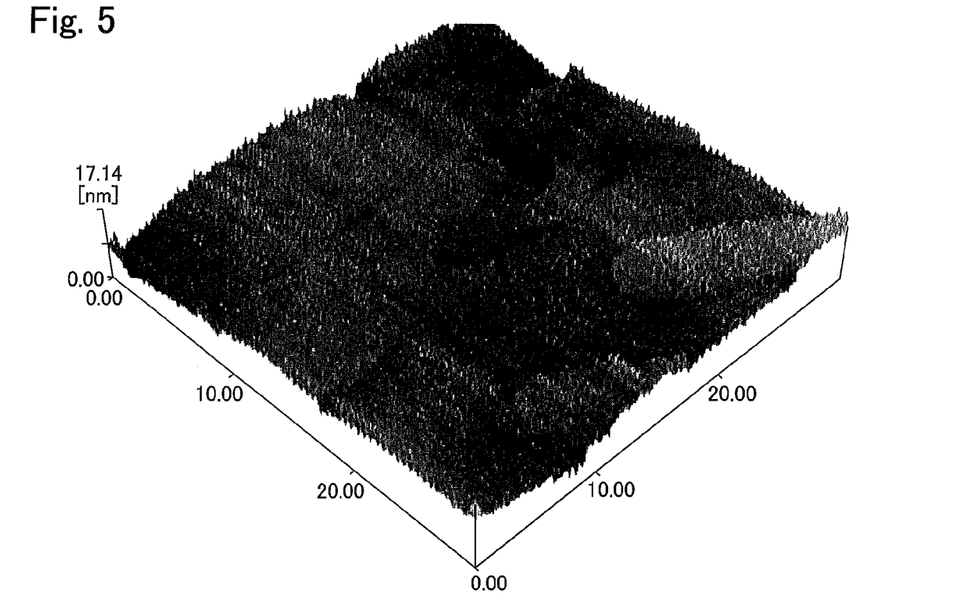
FIG. 5 is a perspective view illustrating a surface configuration of a ceramic composite for light conversion according to Example 3.

After the CMP process, the surface configuration and step level difference of a ceramic composite (square-shaped thin plate sample) for light conversion according to Example 3 were measured using an atomic force microscope (AFM), and an extremely flat surface was obtained such that the step level difference between the $Al_2O_3$ phase and the fluorescence emitting crystalline phase of oxides (YAG phase) was equal to 0.003 µm or less. The results are shown in Table 1. Also, FIG. 5 illustrates the surface configuration of the ceramic composite for light conversion according to Example 3.

Example 4

Next, a ceramic composite for light conversion according to the present invention in Example 4 will be described. A solidified body manufactured in Reference Example was cut into a disc-shaped sample similar to Example 1. When the disc-shaped sample was treated in advance with the fine grinding to produce a mirror surface and the surface configuration and step level difference of the disc-shaped sample were measured using an atomic force microscope (AFM), the step level difference between the $Al_2O_3$ phase and the fluorescence emitting crystalline phase of oxides (YAG phase) was 0.015 µm. The disc-shaped sample was treated with the CMP process under the following condition to yield a ceramic composite for light conversion according to Example 4. A polishing liquid was prepared by adding a 1 mol/L NaOH aqueous solution to "Quartron (registered trademark) PL-2L", a colloidal silica slurry for polishing manufactured by Fuso Chemical Industries Co., Ltd. which was diluted with pure water to 2% by mass for adjusting pH to 11.5. And the polishing liquid for CMP was fed to a polishing pad IC1000 (registered trademark) manufactured by Nitta Haas Incorporated with the lattice-shaped grooves with the spacing of 15 mm and the polishing pad was pressed against the plate-shaped sample of the ceramic composite for light conversion at a pressing load per unit area of 13 kPa to operate the CMP process for 270 minutes as a process time. During the CMP process a 1 mol/L NaOH aqueous solution was added as needed to maintain pH of the polishing liquid for CMP in a range of from 11 to 12.

After the CMP process, the surface configuration and step level difference of a ceramic composite for light conversion according to Example 4 were measured using an atomic force microscope (AFM), and an extremely flat surface was obtained such that the step level difference between the $Al_2O_3$ phase and the fluorescence emitting crystalline phase of oxides (YAG phase) was equal to 0.003 μm or less. The results are shown in Table 1.

Example 5

Figure 6:
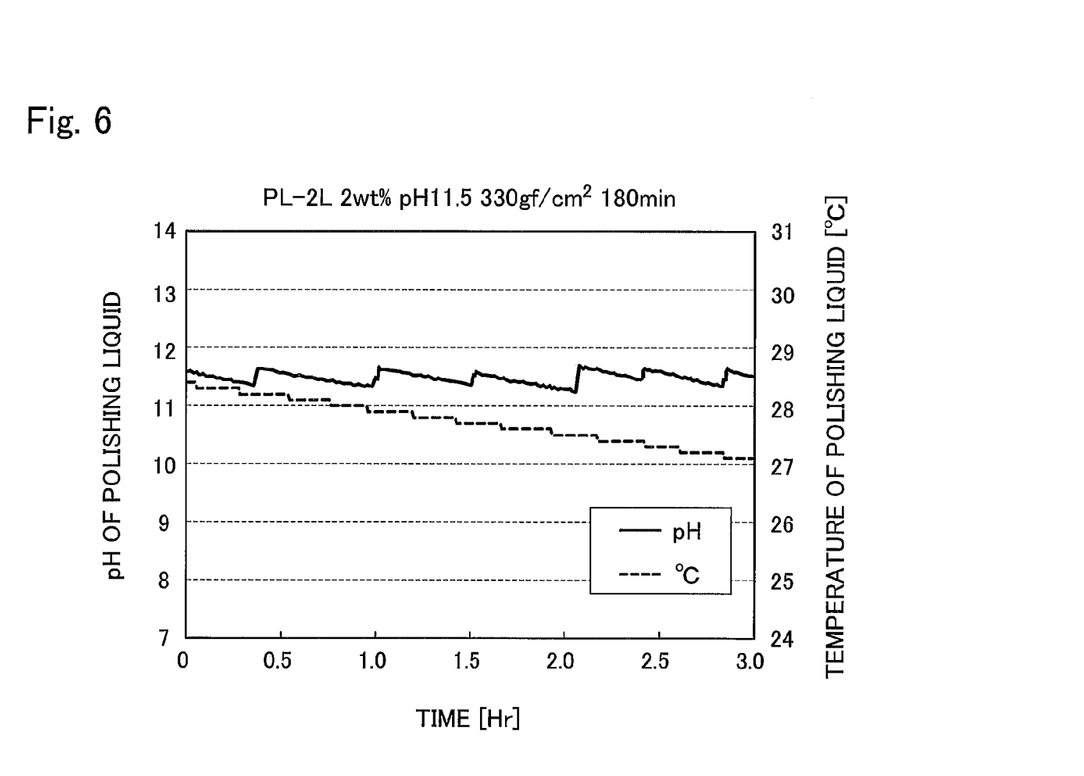
FIG. 6 is a graph illustrating a change of pH of a polishing liquid during the CMP process for a ceramic composite for light conversion according to Example 5.

Next, a ceramic composite for light conversion according to Example 5 of the present invention will be described. A ceramic composite for light conversion according to Example 5 was prepared similarly to Example 4 except for making a pressing load per unit area of the polishing pad to be 33 kPa and a CMP process time to be 180 minutes. Also, FIG. 6 illustrates a change of pH during the CMP process in Example 5.

After the CMP process, the surface configuration and step level difference of a ceramic composite for light conversion according to Example 5 were measured using an atomic force microscope (AFM), and an extremely flat surface was obtained such that the step level difference between the $Al_2O_3$ phase and the fluorescence emitting crystalline phase of oxides (YAG phase) was equal to 0.004 μm or less. The results are shown in Table 1.

Example 6

Next, a ceramic composite for light conversion according to Example 6 of the present invention will be described. A ceramic composite for light conversion according to Example 6 was prepared similarly to Example 4 except for making a pressing load per unit area of the polishing pad to be 50 kPa and a CMP process time to be 120 minutes.

After the CMP process, the surface configuration and step level difference of a ceramic composite for light conversion according to Example 6 were measured using an atomic force microscope (AFM), and a surface with the step level difference between the $Al_2O_3$ phase and the fluorescence emitting crystal phase of oxides (YAG phase) was about 0.007 μm after a CMP process time of 120 minutes. The results are shown in Table 1.

Example 7

Next, a ceramic composite for light conversion according to Example 7 of the present invention will be described. A ceramic composite for light conversion according to Example 7 was prepared similarly to Example 4 except for making the spacing of lattice-shaped grooves of the polishing pad to be 7 mm, a pressing load per unit area applied to the polishing pad to be 33 kPa, and a CMP process time to be 90 minutes.

After the CMP process, the surface configuration and step level difference of a ceramic composite for light conversion according to Example 7 were measured using an atomic force microscope (AFM), and an extremely flat surface was obtained such that the step level difference between the $Al_2O_3$ phase and the fluorescence emitting crystalline phase of oxides (YAG phase) was equal to 0.004 μm or less. The results are shown in Table 1.

Comparative Example 1

As a comparison, a solidified body manufactured in Reference Example was cut into a disc-shaped sample similar to Examples 1 and 2, which was treated in advance with the fine grinding to produce a mirror surface, yielding a ceramic composite for light conversion according to Comparative Example 1 as follows.

Figure 7:
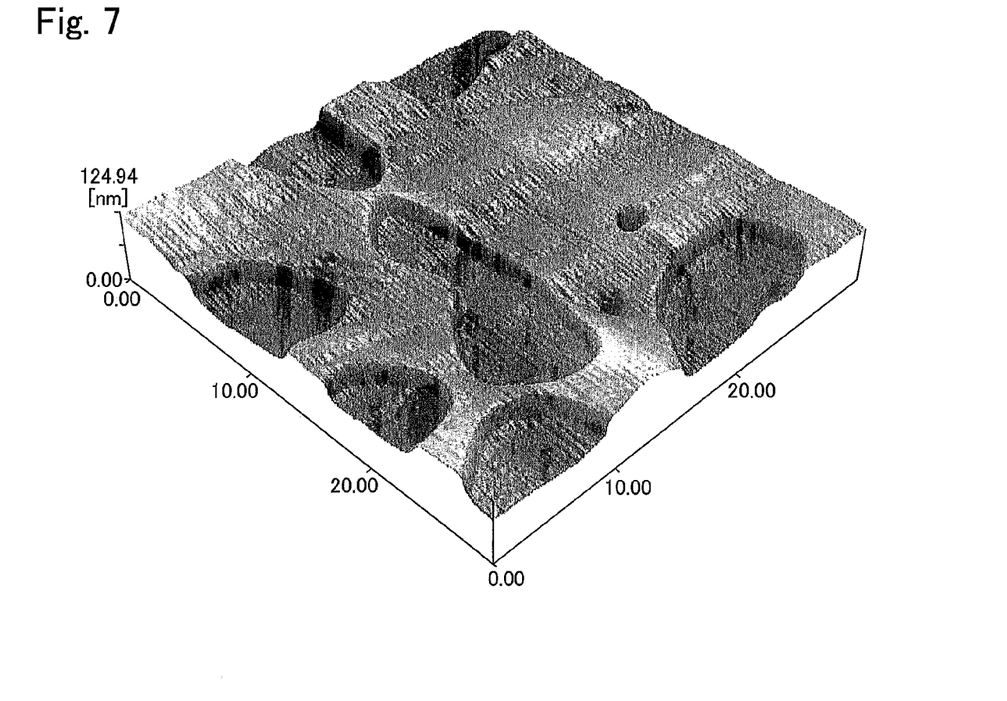
FIG. 7 is a perspective view illustrating a surface configuration of a ceramic composite for light conversion according to Comparative Example 1.

When a stock solution of COMPOL-120 (manufactured by Fujimi Incorporated) of which the content of silica particles was 40% by mass in the polishing liquid for CMP was fed, without dilution with pure water, to the polishing pad (spacing of lattice-shaped grooves: 15 mm, IC-1000 manufactured by Nitta Haas Incorporated) and the polishing pad was pressed against a plate-shaped sample of the ceramic composite for light conversion at a pressing load per unit area of 10 kPa to perform the CMP process for 60 minutes, the surface configuration of the $Al_2O_3$ phase was a convex shape and the step level difference between the $Al_2O_3$ phase and the fluorescence emitting crystalline phase of oxides (YAG phase) was about 0.05 μm. The results are shown in Table 1. FIG. 7 illustrates the surface configuration of a ceramic composite for light conversion according to Comparative Example 1.

Comparative Example 2

As a comparison, a solidified body manufactured in Reference Example was cut into a square-shaped thin plate sample similar to Example 3, which was treated in advance with the fine grinding to produce a mirror surface, yielding a ceramic composite for light conversion according to Comparative Example 2 as follows.

A polishing liquid for CMP was prepared by adding a 1 mol/L NaOH aqueous solution to COMPOL-120 (manufactured by Fujimi Incorporated) of which the content of silica particles in a polishing liquid for CMP was adjusted to 0.4% by mass by dilution with pure water for adjusting pH in a range of from 10.0 to 10.9 during the operation of the CMP process. The polishing liquid for CMP was fed to a polishing pad (lattice-shaped grooves with the spacing: 15 mm, IC-1000 manufactured by Nitta Haas Incorporated) and the polishing pad was pressed against the plate-shaped sample of the ceramic composite for light conversion at a pressing load per unit area of 10 kPa to operate the CMP process for 60 minutes, yielding a ceramic composite for light conversion according to Comparative Example 2.

Figure 8:
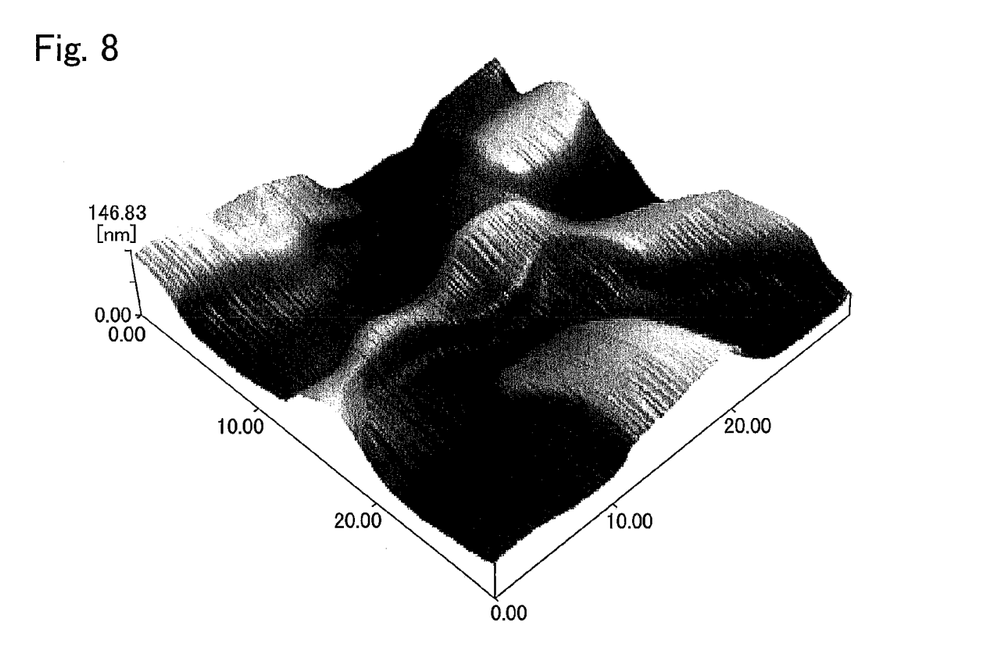
FIG. 8 is a perspective view illustrating a surface configuration of a ceramic composite for light conversion according to Comparative Example 2.

After the CMP process, the surface configuration and step level difference of a ceramic composite (square-shaped thin plate sample) for light conversion according to Comparative Example 2 were measured using an atomic force microscope (AFM), and a surface with the step level difference between the $Al_2O_3$ phase and the fluorescence emitting crystal phase of oxides (YAG phase) to be about 0.100 μm was obtained. The results are shown in Table 1. Also, FIG. 8 illustrates the surface configuration of a ceramic composite for light conversion according to Comparative Example 2.

Comparative Example 3

As a comparison, a solidified body manufactured in Reference Example was cut into a square-shaped thin plate sample similar to Example 3, which was treated in advance with the fine grinding to produce a mirror surface, yielding a ceramic composite for light conversion according to Comparative Example 3 as follows.

A polishing liquid for CMP was prepared by diluting a PL-2L solution (manufactured by Fuso Chemical Industries Co., Ltd.) with pure water to adjust the content of silica particles to 2% by mass in the polishing liquid for CMP. The polishing liquid for CMP was fed to a polishing pad (lattice-shaped grooves with the spacing of 15 mm, IC-1000 manufactured by Nitta Haas Incorporated) and the polishing pad was pressed against the plate-shaped sample of the ceramic composite for light conversion at a pressing load per unit area of 10 kPa to operate the CMP process for 60 minutes, yielding a ceramic composite for light conversion according to Comparative Example 3.

Figure 9:
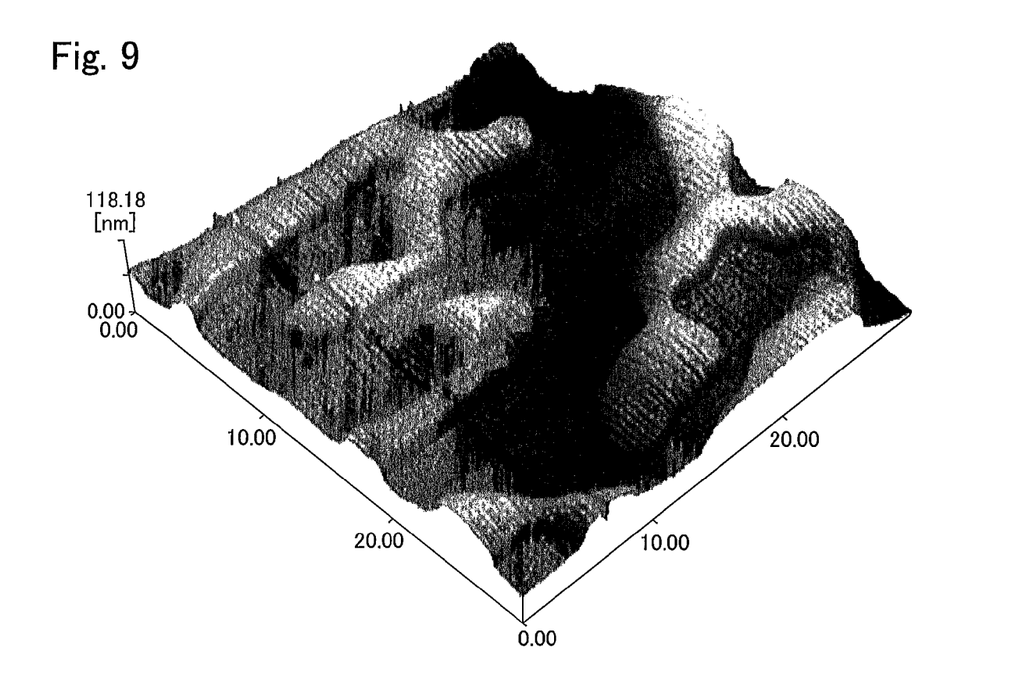
FIG. 9 is a perspective view illustrating a surface configuration of a ceramic composite for light conversion according to Comparative Example 3.

After the CMP process, the surface configuration and step level difference of the ceramic composite (square-shaped thin plate sample) for light conversion according to Comparative Example 3 were measured using an atomic force microscope (AFM), and a surface with the step level difference between the $Al_2O_3$ phase and the fluorescence emitting crystalline phase of oxides (YAG phase) to be about 0.050 was obtained. The results are shown in Table 1. Also, FIG. 9 illustrates the surface configuration of a ceramic composite for light conversion according to Comparative Example 3.

Comparative Example 4

Next, as a comparison, a solidified body manufactured in Reference Example was cut into a disc-shaped sample similar to Example 4, which was processed similarly to Comparative Example 3 except for applying a pressing load per unit area of 13 kPa to the polishing pad and operating the CMP process for 270 minutes, yielding a ceramic composite for light conversion according to Comparative Example 4.

After the CMP process, the surface configuration and the step level difference of a ceramic composite for light conversion according to Comparative Example 4 were measured using an atomic force microscope (AFM), and the step level difference between the $Al_2O_3$ phase and the fluorescence emitting crystalline phase of oxides (YAG phase) was about 0.020 µm, yielding the surface with the step level difference similar to that before the CMP process. The results are shown in Table 1.

Comparative Example 5

As a comparison, a polishing liquid for CMP was next prepared by adding 1 mol/L NaOH aqueous solution to "COMPOL (registered trademark) Type 120" manufactured by Fujimi Incorporated of which the content of silica particles in a polishing liquid for CMP was adjusted to 0.4% by mass by dilution with pure water for adjusting pH above 12. As the results, problems such as coagulation of silica particles in the polishing liquid for CMP occurred.

It is clear from the above results that when pH of the polishing liquid for CMP is kept between 11 and 12 during the CMP process, and the lower the content of silica particles in the polishing liquid for CMP is, the smaller the step level difference between the $Al_2O_3$ phase and the fluorescence emitting crystal phase of oxides (YAG phase) becomes.

According to the present invention, a surface with an extremely small step level difference between the $Al_2O_3$ phase and the fluorescence emitting crystal phase of oxides (YAG phase) can be formed by subjecting a solidified body with mirror-polished surface to CMP process. The step level difference between the $Al_2O_3$ phase and the fluorescence emitting crystal phase of oxides (YAG phase) can be eliminated by the CMP process using an alkaline polishing liquid for CMP containing silica particles and controlling the content thereof, pH of the polishing liquid for CMP, a pressing load per unit area applied in the CMP process, and the spacing of grooves fabricated on the surface of the polishing pad.

REFERENCE SIGNS LIST 1 ceramic composite for light conversion
2 light emitting element (light-emitting diode)
3 electrode terminal for flip-chip mounting
4 anode electrode
5 cathode electrode

The invention claimed is:

1. A method of manufacturing a ceramic composite for light conversion, comprising:
    applying a CMP process to a surface of a solidified body with a structure in which an $Al_2O_3$ phase and a fluorescent emitting crystalline phase of oxides having a hardness smaller than that of $Al_2O_3$ and an alkali resistance higher than that of $Al_2O_3$ that are continuously and three-dimensionally entangled with each other, wherein
    the crystalline phase of oxides is a fluorescence emitting phosphor which is a $(Y, Ce)_3Al_5O_{12}$ (YAG) phase, and pH of a polishing liquid is adjusted between 11 and 12 when performing a CMP process.

2. The method of manufacturing a ceramic composite for light conversion according to claim 1, wherein pH of the polishing liquid is adjusted between 11.3 and 11.6.

3. The method of manufacturing a ceramic composite for light conversion according to claim 2, wherein the polishing liquid contains silica particles and the content thereof is below from 0.1 to 5% by mass.

4. The method of manufacturing a ceramic composite for light conversion according to claim 2, wherein a pressing load per unit area in the CMP process is from 10 to 50 kPa.

5. The method of manufacturing a ceramic composite for light conversion according to claim 1, wherein the polishing liquid contains silica particles and the content thereof is below from 0.1 to 5% by mass.

6. The method of manufacturing a ceramic composite for light conversion according to claim 5, wherein a pressing load per unit area in the CMP process is from 10 to 50 kPa.

7. The method of manufacturing a ceramic composite for light conversion according to claim 1, wherein a pressing load per unit area in the CMP process is from 10 to 50 kPa.

8. The method of manufacturing a ceramic composite for light conversion according to claim 1, wherein the step level difference between the $Al_2O_3$ phase and the crystalline phase of oxides on the surface of the solidified body is equal to 0.010 µm or less.

9. The method of manufacturing a ceramic composite for light conversion according to claim 8,
    wherein the polishing liquid contains silica particles and the content thereof is below from 0.1 to 5% by mass.

10. The method of manufacturing a ceramic composite for light conversion according to claim 9, wherein a pressing load per unit area in the CMP process is from 10 to 50 kPa.

11. The method of manufacturing a ceramic composite for light conversion according to claim 9, wherein a pressing load per unit area in the CMP process is from 10 to 50 kPa.

12. A ceramic composite for light conversion comprising a solidified body with a structure in which an $Al_2O_3$ phase and a fluorescent emitting crystalline phase of oxides which is a $(Y, Ce)_3Al_5O_{12}$ (YAG) phase having a hardness smaller than that of $Al_2O_3$ and an alkali resistance higher than that of $Al_2O_3$ that are continuously and three-dimensionally entangled with each other and a step level difference between the $Al_2O_3$ phase and the fluorescent emitting crystalline phase on a surface of the solidified body is equal to 0.010 μm or less.

\* \* \* \* \*